United States Patent [19]

Koike

[11] Patent Number: 4,609,931
[45] Date of Patent: Sep. 2, 1986

[54] INPUT PROTECTION MOS SEMICONDUCTOR DEVICE WITH ZENER BREAKDOWN MECHANISM

[75] Inventor: Hideharu Koike, Yokohama, Japan

[73] Assignee: Tokyo Shibaura Denki Kabushiki Kaisha, Tokyo, Japan

[21] Appl. No.: 749,112

[22] Filed: Jun. 26, 1985

Related U.S. Application Data

[63] Continuation of Ser. No. 398,355, Jul. 15, 1982, abandoned.

[30] Foreign Application Priority Data

Jul. 17, 1981 [JP] Japan ................................. 56-111917
Jul. 17, 1981 [JP] Japan ................................. 56-111934

[51] Int. Cl.$^4$ ........................ H01L 29/94; H01L 29/90
[52] U.S. Cl. ............................. 357/23.13; 357/23.14; 357/41; 357/42; 357/13; 357/23.7
[58] Field of Search .................. 357/41, 42, 13, 23.13, 357/23.14; 307/304; 361/91

[56] References Cited

U.S. PATENT DOCUMENTS

| | | | |
|---|---|---|---|
| 3,469,155 | 9/1969 | VanBeek | 357/23.13 |
| 3,470,390 | 9/1969 | Lin | 357/23.13 |
| 3,512,058 | 5/1970 | Khajezadeh et al. | 357/23.13 |
| 3,739,238 | 6/1973 | Hara | 357/23.13 |
| 3,806,773 | 4/1974 | Watanabe | 357/23.13 |
| 4,282,556 | 8/1981 | Ipri | 357/42 |

FOREIGN PATENT DOCUMENTS 2435606 2/1976 Fed. Rep. of Germany ...... 307/304

Primary Examiner—Andrew J. James
Assistant Examiner—Charles S. Small, Jr.
Attorney, Agent, or Firm—Finnegan, Henderson, Farabow, Garrett & Dunner

[57] ABSTRACT

A p$^-$-type well region is formed in a n$^-$-type semiconductive substrate. An n-channel metal oxide semiconductor field effect transistor (N-MOSFET) is formed in the p$^-$-type well region. The p$^-$-type well region is electrically insulated from an external potential such as the ground potential. The gate electrode of the N-MOSFET is connected to the p$^-$-type well region. When the N-MOSFET is used as an input protective device of a CMOS integrated circuit, an n$^+$-type layer corresponding to the source electrode of the N-MOSFET is grounded, while another n$^+$-type layer corresponding to the drain electrode thereof is connected to an input terminal of the CMOS integrated circuit through a resistor.

7 Claims, 9 Drawing Figures

INPUT PROTECTION MOS SEMICONDUCTOR DEVICE WITH ZENER BREAKDOWN MECHANISM

This application is a continuation of application Ser. No. 398,355 filed July 15, 1982 now abandoned.

BACKGROUND OF THE INVENTION

The present invention relates to a semiconductor device and, more particularly, to an input protective semiconductor device of a complementary metal oxide semiconductor (CMOS) integrated circuit.

A semiconductor device, especially, a CMOS integrated circuit may operate erroneously or be broken due to an abnormal input such as static electricity, resulting in undesirable phenomena. In order to prevent the undesirable phenomena, a protective circuit is generally arranged in an input stage of the semiconductor integrated circuit. However, most of the conventional input protective circuits mainly serve to prevent electrostatic breakdown of the CMOS. Therefore, the protective circuits cannot sufficiently prevent the erroneous operation and the local damage which may occur prior to the electrostatic breakdown.

An abnormal input voltage applied to the integrated circuit from the outside has a positive or negative voltage polarity. However, the conventional protective circuit only protects the semiconductor integrated circuit from the abnormal input voltage of either polarity. For example, in an input protective circuit for protecting the semiconductor integrated circuit from a positive voltage, the semiconductor integrated circuit cannot be sufficiently protected from an abnormal negative voltage in a required manner. Thus, the conventional protective circuits cannot protect the semiconductor integrated circuit from both the negative and positive voltages.

SUMMARY OF THE INVENTION

It is, therefore, an object of the present invention to provide a new and improved semiconductor device suitable for an input protective circuit which protects a semiconductor integrated circuit from an abnormal input voltage regardless of the polarity of the input voltage.

A semiconductor device according to the present invention has at least two first regions which are close to each other and which have a predetermined conductivity type. At least one second region has a conductivity type opposite to that of the first regions. The second region is formed between the first regions and electrically insulated from an external voltage. An electrically conductive layer is formed substantially above the second region and is at a potential the same or substantially the same as that of the second region. When the semiconductor device of the above arrangement is used for input protection of an integrated circuit which includes MOSFETs, one first region is grounded and the other first region is connected to at least one input terminal of the integrated circuit through a resistor.

BRIEF DESCRIPTION OF THE DRAWINGS

FIG. 8 is a plan view of a modification of the N-MOSFET in FIGS. 5 and 6, showing a silicon-on-sapphire (SOS) structure excluding oxide layers and the like.

DETAILED DESCRIPTION OF THE PREFERRED EMBODIMENTS

Figure 1:
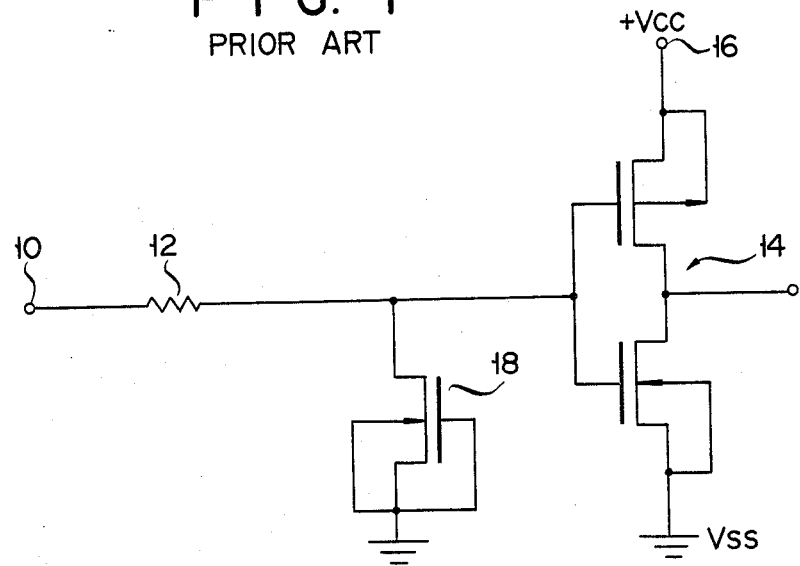
FIG. 1 is a circuit diagram of a conventional basic input protective circuit.

In order to facilitate the understanding of the invention, a basic input protecting circuit will be first described with reference to FIGS. 1 and 2. An input terminal 10 is connected through a protective resistor 12 to a complementary metal oxide semiconductor inverter 14 (to be referred to as a CMOS inverter hereinafter) which includes a p-channel metal oxide semiconductor field effect transistor (to be referred to as a P-MOSFET hereinafter) and an n-channel metal oxide semiconductor field effect transistor (to be referred to as an N-MOSFET hereinafter). The P-MOSFET is connected to a power source terminal 16 to which a power source voltage +Vcc is applied. The N-MOSFET is grounded (potential Vss). An input terminal of the CMOS inverter 14 is grounded through an input protective N-MOSFET 18.

Figure 2:
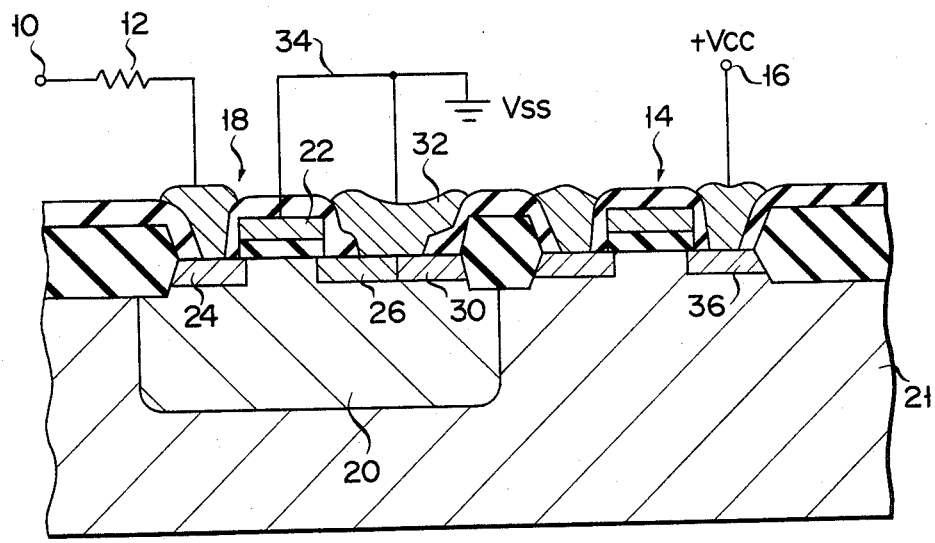
FIG. 2 is a sectional view of an integrated semiconductor device having one substrate on which the conventional input protective circuit in FIG. 1 is formed.

As shown in FIG. 2, the N-MOSFET 18 is formed on a p⁻-type well region 20 which is formed in an n⁻-type semiconductor substrate 21. A gate electrode 22 is separated from drain and source regions 24 and 26 of n⁺ conductivity type through an oxide film. A p⁺-type layer 30 is formed in the p⁻-type well region 20 adjacent to and in contact with the source region 26. The well region 20 is connected to the ground potential Vss through the p⁺-type layer 30 and the metal electrode 32. The gate electrode 22 is connected to the metal electrode 32 through a lead wire 34, so that the gate electrode 22 is connected to the p⁻-type well region 20, the source electrode 26 and the ground potential Vss. The CMOS inverter 14 is placed adjacent to the N-MOSFET 18.

When an abnormal negative input voltage is supplied through the input terminal 10 to the conventional input protective circuit with the above arrangement, an p-n junction between the n⁺-type layer 24 corresponding to a drain electrode of the N-MOSFET 18 and the p⁻-type well region 20 is forward-biased since the p⁻-type well region 20 is grounded through the p⁺-type layer 30 and maintained at the ground potential Vss. A large current flows from the n⁻-type semiconductor substrate 21 to the input terminal 10 to cause the resistor 12 to be destroyed and disconnected.

Under this condition, electrons injected from the n+-type layer 24 into the p−-type well region 20 further flow into the n−-type semiconductor substrate 21. A potential slope is thus established in the n−-type semiconductor substrate 21. Holes are emitted from a p+-type layer 36, which is relatively close to the p−-type well region 20 and connected to the power source terminal 16, of the P-MOSFET included in the CMOS inverter 14 and migrate at last into the p−-type well region 20. Therefore, an undesirable latch-up phenomenon which causes an erroneous operation occurs.

Figure 3:
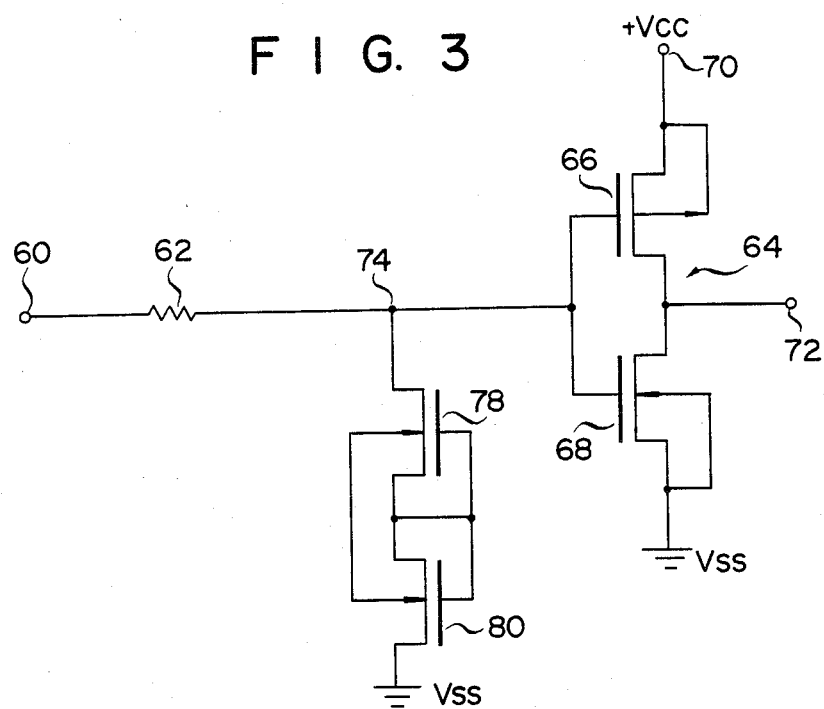
FIG. 3 is a circuit diagram of an input protective circuit according to one embodiment of the present invention.
Figure 4:
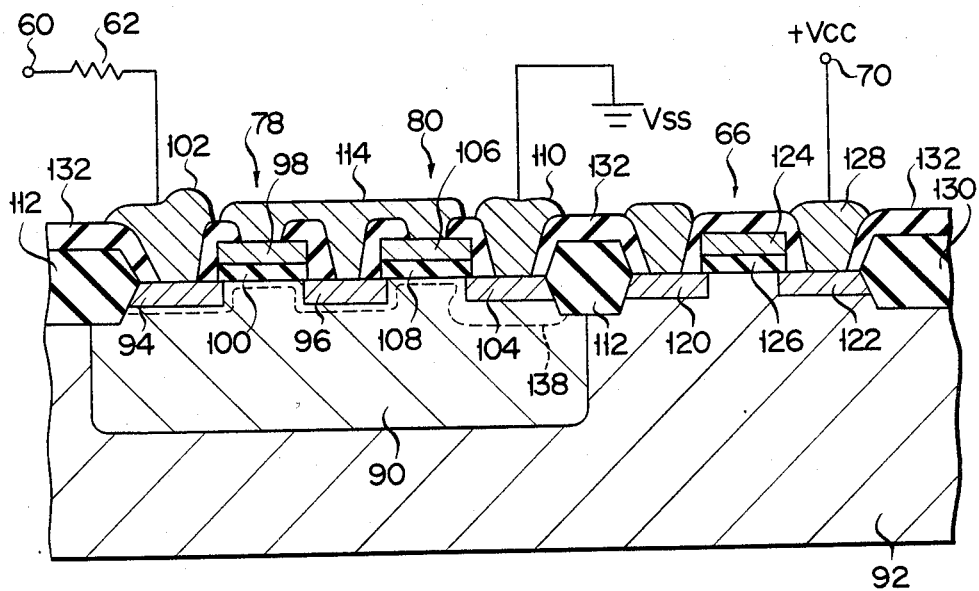
FIG. 4 is a sectional view of an integrated semiconductor device having one substrate on which the input protective circuit according to one embodiment of the present invention is formed.

Referring now to FIGS. 3 and 4, there is illustrated an improved input protective circuit according to one embodiment of the present invention. An input terminal 60 is connected through the protective resistor 62 to a CMOS inverter 64 which includes a P-MOSFET 66 and an N-MOSFET 68. The P-MOSFET 66 has a source electrode connected to a power source terminal 70 to which the power source voltage +Vcc is applied. The source electrode of the N-MOSFET 68 is grounded. The drain electrodes of the P-MOSFET 66 and the N-MOSFET 68 are connected to each other and further connected to an output terminal 72 of the CMOS inverter 64. The gate electrodes of the P-MOSFET 66 and the N-MOSFET 68 are connected to each other and further connected to the input terminal 60 through the resistor 62.

A common node 74 between the resistor 62 and the gate electrodes of the P- and N-MOSFETs 66 and 68 included in the CMOS inverter 64 is grounded through first and second input protective N-MOSFETs 78 and 80. To be more specific, the common node 74 is connected to the drain electrode of the first N-MOSFET 78. A gate electrode of the first N-MOSFET 78 is connected to a source electrode thereof which is connected to a drain electrode of the second N-MOSFET 80. The gate electrode of the first N-MOSFET 78 is further connected to a gate electrode of the second N-MOSFET 80. The gate electrode of the first N-MOSFET 78 is electrically insulated from an external voltage such as the ground potential Vss. A source electrode of the second N-MOSFET 80 is connected to ground whose potential is designated by Vss.

FIG. 4 is a sectional view of the integrated semiconductor device on which the input protective circuit shown in FIG. 3 according to the present invention is formed. In FIG. 4, a p−-type well region 90 is formed in an n−-type semiconductor substrate 92. The first and second input protective N-MOSFETs 78 and 80 are formed on the p−-type well region 90. The first N-MOSFET 78 has n+-type layers 94 and 96 corresponding to the drain and source electrodes thereof, respectively, and a polycrystalline silicon layer 98 corresponding to the gate electrode which is electrically insulated from the n+-type layers 94 and 96 through a gate oxide film 100. A metal layer 102 of aluminum or the like is deposited on the n+-type layer 94 and further connected to the resistor 62 and the input terminal 60. The n+-type layer 96 of the first N-MOSFET 78 serves not only as the source electrode of the first N-MOSFET 78 but also as the drain electrode of the second N-MOSFET 80. The second N-MOSFET 80 has an n+-type layer 104 corresponding to the source electrode. A polycrystalline silicon layer 106 is electrically insulated from the n+-type layers 96 and 104 through a gate oxide film 108. The polycrystalline silicon layer 106 corresponds to the gate electrode of the second N-MOSFET 80. The n+-type layer 104 corresponding to the source electrode of the second N-MOSFET 80 is grounded through a metal layer 110 of aluminum or the like. Since this source electrode has an n+ conductivity type, the p−-type well region 90 is substantially electrically insulated or isolated from the ground potential Vss. The N-MOSFETs 78 and 80 are electrically insulated from circuit elements integrated on the n−-type semiconductor substrate 92 through field oxide films 112. A metal layer 114 is deposited over the region extending between the adjacent first and second N-MOSFETs 78 and 80. The polycrystalline silicon layers 98 and 106 corresponding to the gate electrodes are electrically connected by the metal layer 114 to the n+-type layer 96 which corresponds to the source electrode of the first N-MOSFET 78 and the drain electrode of the second N-MOSFET 80.

The P-MOSFET 66 and the N-MOSFET 68 which are included in the CMOS inverter 64 are formed in a surface portion of the n−-type semiconductor substrate 92 and are substantially adjacent to the first and second N-MOSFETs 78 and 80 (the N-MOSFET 68 is not visible in FIG. 4). The P-MOSFET 66 has p+-type layers 120 and 122 which respectively correspond to the drain and source electrodes thereof. The P-MOSFET 66 further has a polycrystalline silicon layer 124 which is electrically insulated or separated from the p+-type layers 120 and 122 through an oxide film 126 and functions as the gate electrode. The p+-type layer 122 corresponding to the source electrode of the P-MOSFET 66 is connected to the power source terminal 70 through a metal layer 128 of aluminum or the like. Note that reference numeral 130 denotes a field oxide film and reference numeral 132 denotes an insulating film.

In the input protective circuit with the above arrangement according to one embodiment of the present invention, assume that an abnormal negative input voltage from the input terminal 60 is applied to the n+-type layer 94 corresponding to the drain electrode of the first N-MOSFET 78. Since the p−-type well region 90 is not connected to the ground potential Vss, the p−-type well region 90 is set at a negative potential in accordance with the potential of the n+-type layer 94. The potential of the n+-type layer 96 is higher ($V_{IN}+V_{THN}$) than that of the n+-type layer 94 by a threshold voltage $V_{THN}$ of the N-MOSFET 78. The p-n junction between the n+-type layer 104 corresponding to the source electrode of the second N-MOSFET 80 and the p−-type well region 90 is reverse-biased. The depletion layer in the p−-type well region 90 is formed as indicated by a dotted line 138 in FIG. 4. When the reverse-bias voltage exceeds a predetermined breakdown voltage, holes are injected from the n+-type source electrode 104 of the second MOSFET 80 into the p−-type well region. However, most of holes migrate toward the input terminal 60 since the potential at the p−-type well region 90 is higher than that at the input terminal 60. The holes are not injected in the semiconductor substrate 92. Therefore, the undesirable latch-up phenomenon does not occur. Under this condition, the p−-type well region 90 is set at a negative potential, and the p-n junction between the p−-type well region 90 and the n+-type drain electrode 94 of the first N-MOSFET 78 may not be forward-biased. Even if a negative surge voltage is applied to the input terminal 60, a forward large current does not flow. The protective resistor 62 may not be destroyed and disconnected. According to the input protective circuit of one embodiment of the present invention, the integrated semiconductor device may not break down and/or erroneously operate due to the positive and negative input surge voltage applied from the outside.

Figure 5:
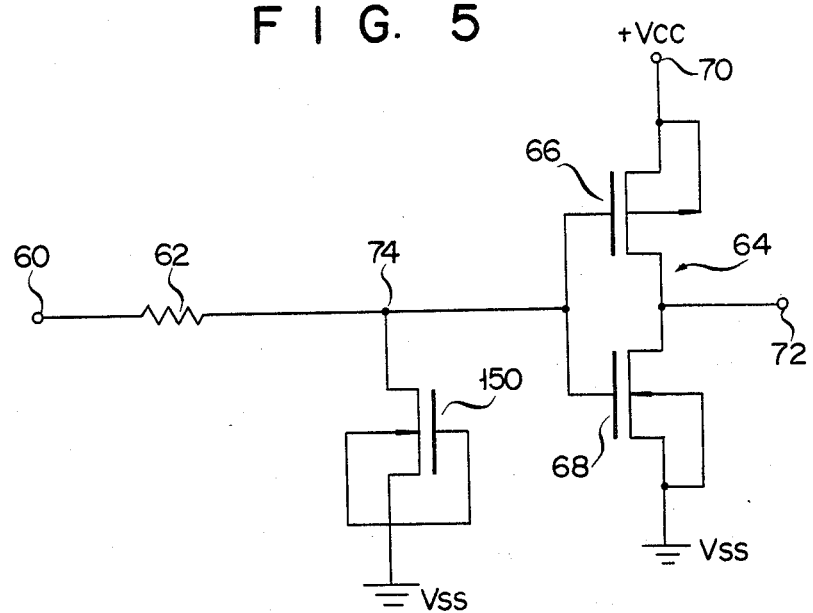
FIG. 5 is a circuit diagram of an input protective circuit according to another embodiment of the present invention.
Figure 6:
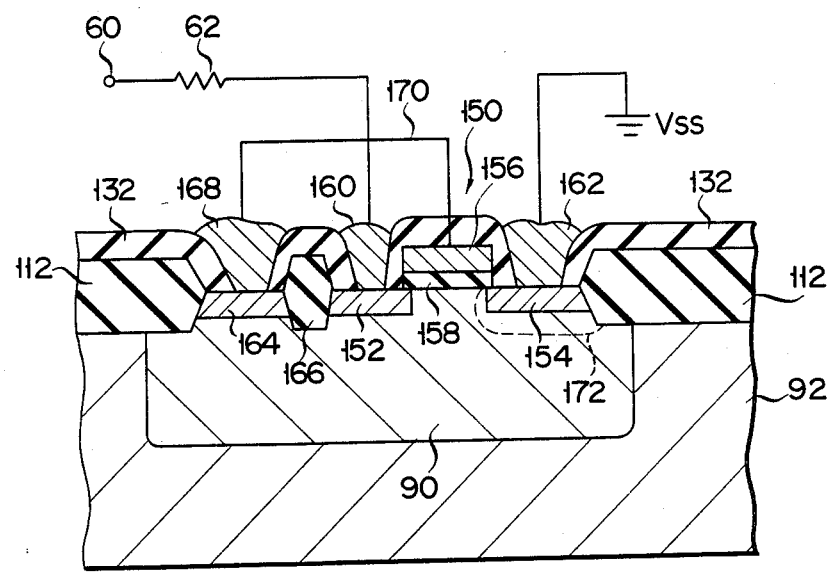
FIG. 6 is a sectional view of an integrated semiconductor device on which the input protective circuit shown in FIG. 5 is formed.

FIGS. 5 and 6 show an input protective circuit according to another embodiment of the present invention. The same reference numerals as in the first embodiment denote the same parts in the second embodiment, and a detailed description thereof will be omitted. The common node 74 between the CMOS inverter 64 and the resistor 62 is grounded through a single N-MOSFET 150. The N-MOSFET 150 is provided on the p⁻-type well region 90 formed in the n⁻-type semiconductor substrate 92. The drain and source electrodes of the N-MOSFET 150 comprise N⁺-type layers 152 and 154. The gate electrode of the N-MOSFET 150 comprising a polycrystalline silicon layer 156 is electrically insulated from the drain and source electrodes through an oxide film 158. The n⁺-type drain electrode 152 is subsequently connected to the resistor 62 and the input terminal 60 through a metal layer 160 made of a metal such as aluminum. The n⁺-type layer 154 corresponding to the source electrode is grounded through the metal layer 162.

A p⁺-type layer 164 is electrically insulated from the N-MOSFET 150 through a field oxide film 166. A metal layer 168 is deposited on the p⁺-type layer 164. The metal layer 168 is connected to the gate electrode 156 of the N-MOSFET 150 through a lead wire 170. The p⁺-type layer 164 functions to electrically connect the p⁻-type well region 90 to the gate electrode 156. Therefore, the potential of the p⁻-type well region 90 is substantially the same as that of the gate electrode 156 of the N-MOSFET 150.

Figure 7:
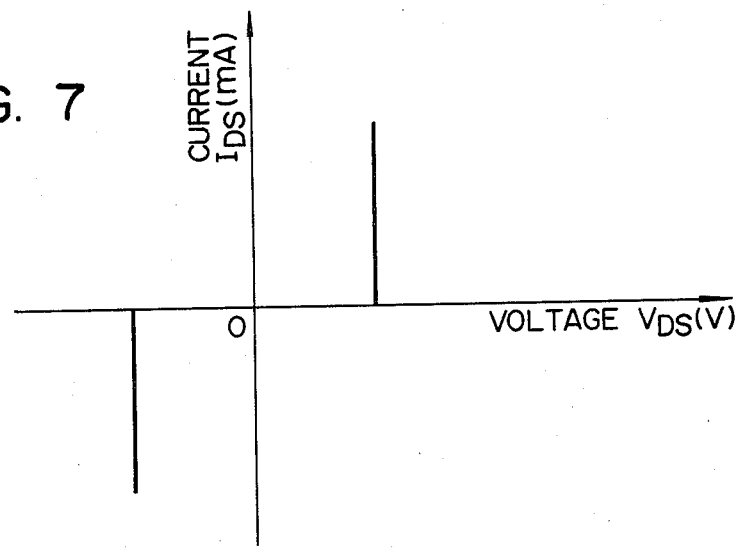
FIG. 7 is a graph showing the voltage-current characteristics of an n-channel metal oxide semiconductor field effect transistor (to be referred to as an N-MOSFET hereinafter)

The mode of operation of the N-MOSFET 150 will be described. When a positive voltage is applied to the drain electrode 152 of the N-MOSFET 150 and the source electrode 154 thereof is grounded, a potential on the p⁻-type well region 90 is drawn in a manner to follow the ground potential Vss of the source electrode 154 and held substantially at a level equal to that of the ground potential Vss. At this time, the p-n junction between the n⁺-type drain electrode 152 and the p⁻-type well region 90 is reverse-biased. When the drain voltage is lower than a predetermined voltage, no current flows between the drain and source electrodes of the N-MOSFET 150. However, when the drain voltage is higher than the predetermined voltage, the Zener breakdown phenomenon occurs in the p-n junction between the n⁺-type drain electrode 152 and the p⁻-type well region 90. Therefore, a current flows between the drain and the source electrodes. Since the drain and source electrodes of the N-MOSFET 150 are equivalent, the voltage ($V_{DS}$)-current ($I_{DS}$) characteristics as shown in FIG. 7 are obtained.

In the input protective circuit including the N-MOSFET 150 shown in FIGS. 5 and 6, when a positive surge voltage is applied to the input terminal 60, Zener breakdown occurs in the p-n junction between the p⁻-type well region 90 and the n⁺-type drain electrode 152 of the N-MOSFET 150. As a result, the holes are injected from the n⁺-type drain electrode 152 to the p⁻-type well region 90. The holes are diffused into the p⁻-type well region 90 and migrate from the n⁺-type source electrode 154 to the ground. Thus, as the holes do not remain in the p⁻-type well region 90 and flow to the ground, the latch-up phenomenon is prevented.

When a negative surge voltage is applied to the input terminal 60, Zener breakdown occurs in the p-n junction between the p⁻-type well region 90 and the n⁺-type layer 154 corresponding to the source electrode of the N-MOSFET 150. A depletion layer is formed in the p⁻-type region 90 as indicated by a dotted line 172 in FIG. 6. The holes are then injected in the p⁻-type region 90 and diffused thereinto. The holes flow into the input terminal 60 through the n⁺-type layer 152.

According to the input protective circuit of the second embodiment of the present invention, even if the positive or negative surge voltage is applied to the input terminal 60, the latch-up phenomenon does not occur. Further, even if a low negative dc voltage is applied, a current does not flow to semiconductor substrate 92. The protective resistor 62 may not be destroyed and disconnected. Further, in the input protective circuit according to the second embodiment of the present invention, only one MOSFET is used. Therefore, the pattern area of the integrated semiconductor device can be decreased.

Figure 8:
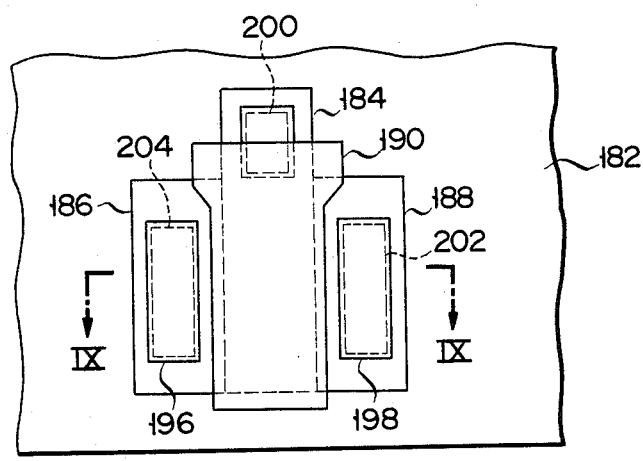
Figure 9:
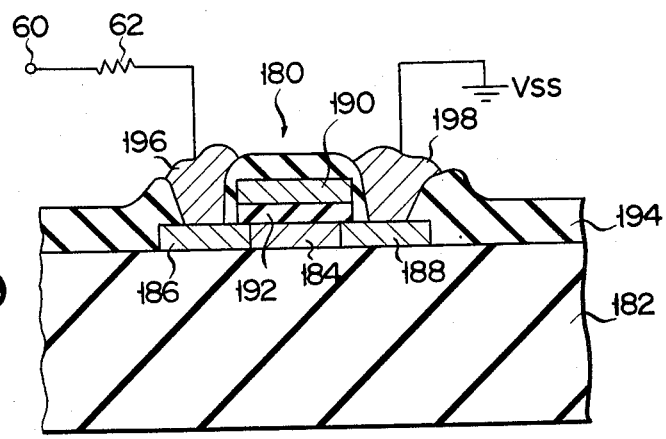
FIG. 9 is a sectional view of the N-MOSFET when taken along the line IX—IX in FIG. 8.

A modification of the above-mentioned N-MOSFET 150 is shown in FIGS. 8 and 9. An N-MOSFET 180 has a silicon-on-sapphire (SOS) structure. Reference numeral 182 denotes a sapphire substrate 182 on which a monocrystalline silicon layer 184 of p⁻ conductivity type is formed by the epitaxial growth method. Monocrystalline silicon layers 186 and 188 of n⁺ conductivity type are formed at both sides of the p⁻-type silicon layer 184 on the substrate 182. One n⁺-type layer 186 functions as a drain electrode of the N-MOSFET 180 and the other n⁺-type layer 188 functions as a source electrode thereof. The p⁻-type layer 184 formed between the n⁺-type layers 186 and 188 corresponds to a channel region of the N-MOSFET 180. A polycrystalline silicon layer 190 corresponding to a gate electrode of the N-MOSFET 180 is electrically insulated from the p⁻-type layer 184 and the n⁺-type layers 186 and 188 through an oxide film 192. Reference numeral 194 denotes an insulating layer. Metal layers 196 and 198 are deposited on the n⁺-type layers 186 and 188 corresponding to the drain and source electrodes, respectively. As shown in FIG. 9, the metal layer 196 is connected to the input terminal 60 through the resistor 62, and the metal layer 198 is connected to ground.

Referring to FIG. 8, a contact hole 200 is formed to electrically connect the gate electrode 190 with the p⁻-type channel region 184. A contact hole 202 is formed to electrically connect the metal layer 198 with the n⁺-type source electrode 188. A contact hole 204 is formed to electrically connect the metal layer 196 with the n⁺-type drain electrode 186. The N-MOSFET 180 having the SOS structure is equivalent to the N-MOSFET 150 as seen from FIG. 5. The voltage-current characteristic of the N-MOSFET 180 is the same as that shown in FIG. 7.

Although the present invention has been shown and described with respect to particular embodiments, nevertheless, various changes and modifications which are obvious to a person skilled in the art to which the invention pertains are deemed to lie within the spirit, scope, and contemplation of the invention. For example, the conductivity type of the semiconductor substrate shown in FIGS. 4 and 6 may be of the opposite type. Although the semiconductor device according to the present invention is suitable for an input protective circuit of the CMOS integrate circuit element, the above-mentioned electrical characteristics may be utilized in a variety of applications.

What is claimed is:

1. A semiconductor device to provide overvoltage protection at an input terminal of an integrated circuit, said device comprising:
   a semiconductor substrate of a first conductivity type and having a first surface portion on which said integrated circuit is formed, and a second surface portion;
   a semiconductor well region of a second conductivity type formed in said second surface portion of said substrate; and
   a metal oxide semiconductor field effect transistor formed in said well region and having a grounded source layer of said first conductivity type, a drain layer of said first conductivity type connected to said input terminal, and a gate layer electrically connected to said semiconductor well region, whereby, when an abnormally large voltage appears at the input terminal, Zener breakdown occurs between said well region and said source or drain layer and the well region potential approaches the potential of said drain or source layer according to the polarity of said abnormally large voltage.

2. A semiconductor device according to claim 1 further comprising a semiconductive layer of the second conductivity type formed in said well region, and wherein said gate layer of said field effect transistor is directly connected to said semiconductor layer.

3. A semiconductor device according to claim 2, wherein said device further comprises:
   an oxide layer formed in said well region between said drain layer and said semiconductor layer; and
   means for electrically connecting said semiconductor layer to said gate layer.

4. A semiconductor device according to claim 3, further comprising:
   a resistor connected between said drain layer of said transistor and said input terminal of said integrated circuit.

5. A semiconductor device to provide overvoltage protection at an input terminal of an integrated circuit, said device comprising:
   an Insulating substrate havIng a first surface portion on which said integrated circuit is formed, and a second surface portion; and
   a metal oxide semiconductor field effect transistor formed in said surface portion of said substrate, said field effect transistor having a grounded source layer of a first conductivity type, a drain layer of the first conductivity type connected to said input terminal, a channel layer of a second condutivity type formed between said source and drain layer on said substrate, and a gate layer electrically connected to said channel layer, whereby, when an abnormally large voltage appears at said input terminal, Zener breakdown occurs between said channel layer and said source or drain layer and the channel layer potential approaches the potential of said drain or source layers, according to the polarity of said abnormally large voltage.

6. A semiconductor device according to claim 5, wherein said field effect transistor comprises an insulating layer formed between said gate layer and said channel layer, and said insulating layer having a contact hole through which said gate layer is directly connected to said channel layer.

7. A semiconductor device according to claim 6, wherein said insulating substrate comprises a sapphire substrate.

* * * * *

UNITED STATES PATENT AND TRADEMARK OFFICE
CERTIFICATE OF CORRECTION

PATENT NO. : 4,609,931

DATED : September 2, 1986

INVENTOR(S) : Koike, Hideharu

It is certified that error appears in the above-identified patent and that said Letters Patent is hereby corrected as shown below:

In the title page of the Letters Patent with respect to the address of the assignee, please replace "Tokyo" with --Kawasaki--;

In the Foreign Application Priority Data, replace "56-111917" with --56-111927-- of the Japanese application; and Column 8, line 9, replace "Insulating" with --insulating-- and replace "havIng" with --having--.

Signed and Sealed this

Twenty-fourth Day of March, 1987

*Attest:*

DONALD J. QUIGG

*Attesting Officer*  *Commissioner of Patents and Trademarks*